(12) United States Patent
Cho

(10) Patent No.: US 7,545,632 B2
(45) Date of Patent: Jun. 9, 2009

(54) PLASMA DISPLAY APPARATUS

(75) Inventor: In-Soo Cho, Suwon-si (KR)

(73) Assignee: Samsung SDI Co., Ltd., Suwon-si, Gyeonggi-do (KR)

( * ) Notice: Subject to any disclaimer, the term of this patent is extended or adjusted under 35 U.S.C. 154(b) by 687 days.

(21) Appl. No.: 11/350,814

(22) Filed: Feb. 10, 2006

(65) Prior Publication Data

US 2006/0198089 A1 Sep. 7, 2006

(30) Foreign Application Priority Data

Mar. 3, 2005 (KR) .................... 10-2005-0017664

(51) Int. Cl.
*G06F 1/16* (2006.01)
*H05K 5/00* (2006.01)
*H05K 7/00* (2006.01)

(52) U.S. Cl. .................................... 361/681
(58) Field of Classification Search ........... 361/681, 361/719, 704, 707
See application file for complete search history.

(56) References Cited

U.S. PATENT DOCUMENTS 6,407,508 B1 * 6/2002 Kawada et al. ........... 315/169.3
6,703,702 B2 * 3/2004 Inoue et al. ................. 257/684

FOREIGN PATENT DOCUMENTS

| JP | 2000-132116 | 5/2000 |
| JP | 2001-013883 | 1/2001 |
| JP | 2001-352022 | 12/2001 |
| JP | 2003-115568 | 4/2003 |
| JP | 2004-361913 | 12/2004 |

OTHER PUBLICATIONS

*Office action* from the Japanese Patent Office issued in Applicant's corresponding Japanese Patent Application No. 2005-312594 dated Aug. 12, 2008.

* cited by examiner

*Primary Examiner*—Javaid Nasri
(74) *Attorney, Agent, or Firm*—Robert E. Bushnell, Esq.

(57) ABSTRACT

A plasma display apparatus capable of preventing devices from being damaged by installing a cover so as not to apply locally excessive pressure onto at least one device formed on at least one signal transmission member includes: a Plasma Display Panel (PDP); a chassis base disposed on a rear portion of the PDP; a circuit board disposed on a rear portion of the chassis base to drive the PDP; at least one signal transmission member connecting the PDP to the circuit board to transmit electrical signals therebetween and including at least one device; a reinforcing member including a mounting portion, on which the at least one signal transmission member is disposed and the at least one device installed on the signal transmission members is mounted, at an edge of the chassis base, and at least one boss disposed on the mounting portion; and a cover installed on a rear portion of the at least one signal transmission member to cover the at least one device formed on the at least one signal transmission member, and attached to the at least one boss of the reinforcing member by a coupling unit.

9 Claims, 4 Drawing Sheets

PLASMA DISPLAY APPARATUS

CLAIM OF PRIORITY

This application makes reference to, incorporates the same herein, and claims all benefits accruing under 35 U.S.C. §119 from an application for PLASMA DISPLAY APPARATUS earlier filed in the Korean Intellectual Property Office on Mar. 3, 2005 and there duly assigned Serial No. 10-2005-0017664.

BACKGROUND OF THE INVENTION

1. Field of the Invention

The present invention relates to a plasma display apparatus, and more particularly, to a plasma display apparatus having an improved structure capable of preventing a device mounted on a signal transmission member from being damaged.

2. Description of the Related Art

Plasma display apparatuses are flat panel displays which display images using a gas discharge, and are considered to be next generation flat panel displays that can substitute for cathode raytubes due to their excellent display properties including display capacity, brightness, contrast, residual image, and viewing angle.

In general, the plasma display apparatus includes a Plasma Display Panel (PDP), a chassis base disposed parallel to the PDP, a circuit board mounted on a rear portion of the chassis base to drive the PDP, and a case to receive the PDP, the chassis base, and the circuit board.

In the plasma display apparatus, a signal transmission member, such as a Tape Carrier Package (TCP) formed into a package by mounting a plurality of devices on a tape wiring unit, electrically connects the PDP to the circuit board. The TCP is flexible since it is formed of the tape wiring unit, and can reduce the size of the circuit board since a plurality of devices can be mounted on the TCP.

A cover member covers the mounted devices and is attached to the chassis base on the rear portion of the TCP to protect the devices and to dissipate heat generated by the devices.

However, after the cover member is attached to the chassis base, the surface of the cover member facing the devices and the surface of the chassis base where the devices are mounted may not be parallel to each other, but can be slanted to each other. Then, pressure is concentrated locally onto the devices located between the cover member and the chassis base, and, the devices can be damaged.

SUMMARY OF THE INVENTION

The present invention provides a plasma display apparatus including a cover member installed so as not to concentrate pressure locally onto devices mounted on a signal transmission member, thereby preventing the devices from being damaged.

The present invention also provides a plasma display apparatus preventing fabrication costs from being increased due to damage of the devices.

According to an aspect of the present invention, a plasma display apparatus is provided including: a Plasma Display Panel (PDP); a chassis base arranged on a rear portion of the PDP; a circuit board arranged on a rear portion of the chassis base to drive the PDP; at least one signal transmission member adapted to connect the PDP to the circuit board to transmit electrical signals therebetween and including at least one device; a reinforcing member including a mounting portion, on which the at least one signal transmission member is arranged and the at least one device installed on the at least one signal transmission member is mounted, at an edge of the chassis base, and at least one boss arranged on the mounting portion; a cover arranged on a rear portion of the at least one signal transmission member to cover the at least one device arranged on the at least one signal transmission member; and a coupling unit adapted to attach the cover to the at least one boss of the reinforcing member.

The reinforcing member preferably includes a bent end portion of the chassis base.

The at least one boss preferably includes a plurality of bosses separated from each other and arranged on the mounting portion. The at least one boss is preferably integrally formed with the mounting portion.

The at least one device is preferably arranged on the mounting portion which is separated from the chassis base to be parallel to the chassis base, and the reinforcing member preferably includes a base portion attached to the chassis base, and a connection portion adapted to connect the base portion to the mounting portion.

A first thermal conductive medium is preferably arranged between the at least one device on the at least one signal transmission member and the reinforcing member.

A second thermal conductive medium is preferably arranged between the at least one device on the at least one signal transmission member and the cover. The second thermal conductive medium preferably includes a shock-absorbing material.

The at least one boss preferably protrudes from the mounting portion to facilitate the cover being adhered to the second thermal conductive medium covering the at least one device.

BRIEF DESCRIPTION OF THE DRAWINGS

A more complete appreciation of the present invention, and many of the attendant advantages thereof, will be readily apparent as the present invention becomes better understood by reference to the following detailed description when considered in conjunction with the accompanying drawings in which like reference symbols indicate the same or similar components, wherein.

DETAILED DESCRIPTION OF THE INVENTION

Figure 1:
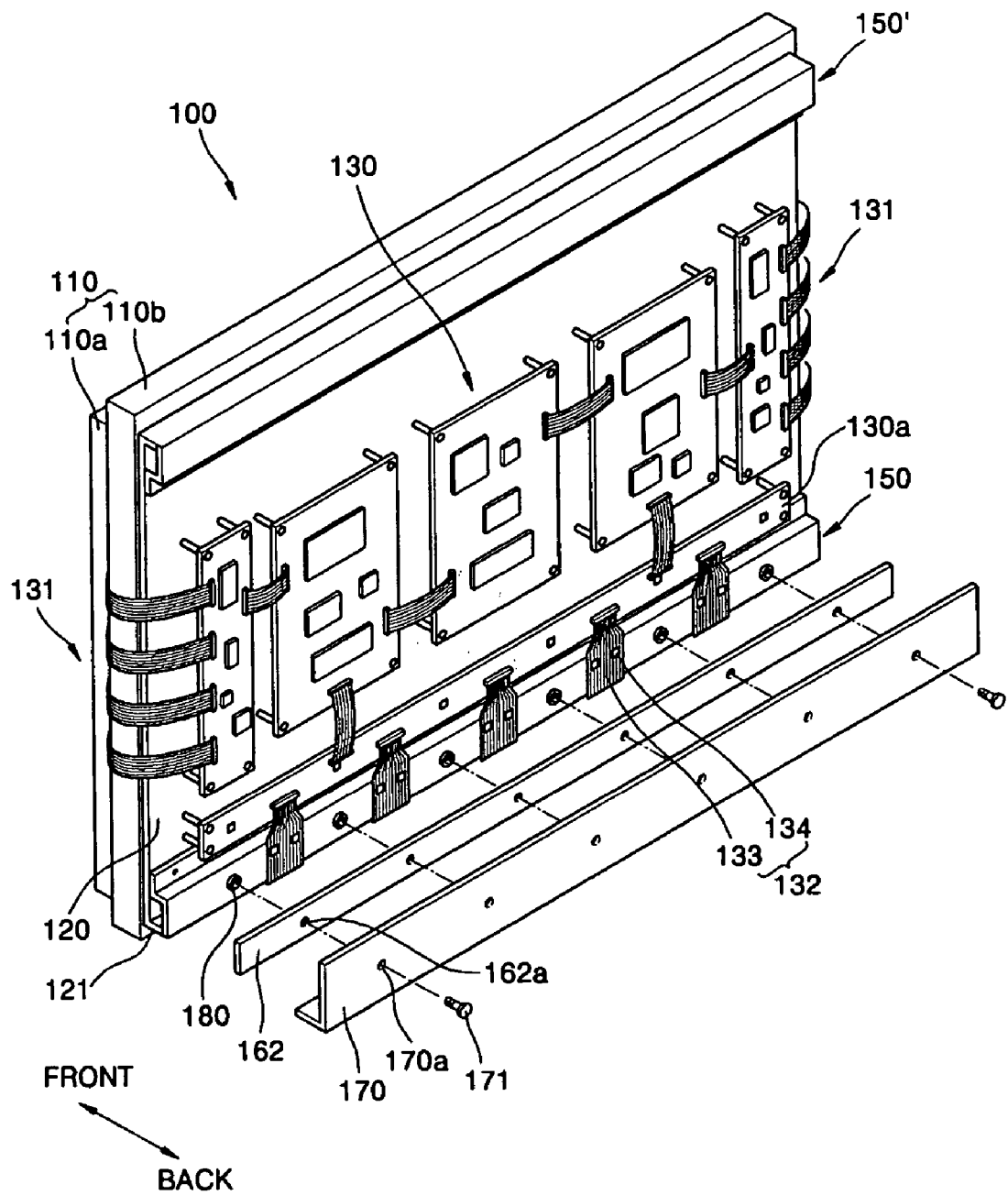
FIG. 1 is an exploded perspective view of a plasma display apparatus according to an embodiment of the present invention.

FIG. 1 is an exploded perspective view of a plasma display apparatus according to an embodiment of the present invention.

Referring to FIG. 1, the plasma display apparatus 100 according to the present invention includes a Plasma Display Panel (PDP) 110 which displays images.

The PDP 110 can be one of various kinds of PDPs, for example, an Alternating current (AC) PDP having a surface-discharge three-electrode structure.

The AC PDP having the surface discharge three-electrode structure includes a front panel and a rear panel attached to the front panel. The front panel includes a front substrate disposed on a front portion, sustain electrode pairs including pairs of X and Y electrodes and formed on a rear surface of the front substrate, a front dielectric layer formed to cover the sustain electrode pairs, and a protective layer formed on a rear surface of the front dielectric layer. The X and Y electrodes forming the sustain electrode pair are separated from each other by a discharge gap, and respectively perform as a common electrode and a scan electrode. In addition, the X electrode includes an X transparent electrode and an X bus electrode connecting to the X transparent electrode, and the Y electrode includes a Y transparent electrode and a Y bus electrode connecting to the Y transparent electrode. The rear panel attached to the front panel includes a rear substrate formed on a rear portion, address electrodes formed on a front surface of the rear substrate and extending in a direction crossing the sustain electrode pairs, a rear dielectric layer covering the address electrodes, barrier ribs formed on a front surface of the rear dielectric layer to define discharge spaces, and a phosphor layer disposed in the discharge spaces. The discharge spaces correspond to areas where the sustain electrode pairs and the address electrodes cross each other, and a discharge gas is contained within the discharge spaces.

A chassis base 120 is disposed on a rear portion of the PDP 110 having the above structure. The chassis base 120 is formed of aluminum to support the PDP 110 and to dissipate heat generated by the PDP 110 to the outside. The chassis base 120 can include a bending portion 121 that is bent to the rear portion at the edges thereof in order to stiffen the chassis base 120.

In addition, a circuit board 130 is installed on the rear portion of the chassis base 120 to drive the PDP 110, and the circuit board 130 includes a plurality of electronic elements. The circuit board 130 is received into the case (not shown) with the PDP 110 and the chassis base 120 to form the plasma display apparatus 100.

In addition, the circuit board 130 is electrically connected to the PDP 110 by a signal transmission member to transmit the signals. The signal transmission member can be one of a Flexible Printed Cable (FPC), a Tape Carrier Package (TCP), or a Chip on Film (COF).

According to the present invention, FPCs 131 are adopted as the signal transmission members disposed at left and right sides of the chassis base 120 and connected to the circuit board 130, and the TCPs 132 that are formed as packages, each of which is formed by mounting at least one device 134 on a tape wiring unit 133, are adopted as the signal transmission members disposed on a lower portion of the chassis base 120 and connected to the circuit board 130.

The TCPs 132 are separated from each other. The wiring units 133 of the TCPs 132 pass through the lower edge portion of the chassis base 120, one end portions thereof being connected to address electrodes (not shown) formed on the PDP 110, and the other end portions thereof being connected to a driving circuit board 130a driving the address electrodes of the circuit board 130. In addition, two or more devices 134, such as address driving Integrated Circuits (ICs), are mounted on the wiring unit 133 of each TCP 132, and the devices 134 are disposed adjacent to the rear edge of the chassis base 120.

The devices 134 are supported by a reinforcing member 150, and thus, the reinforcing member 150 is disposed between the chassis base 120 and the TCPs 132 so that the TCPs 132 are disposed on a rear surface of the reinforcing member 150 and the devices 134 can correspond to the TCPs 132. The reinforcing member 150 can be formed of metal and is attached to the rear surface of the chassis base 120 to prevent the chassis base 120 from being bent or curved and to increase the heat dissipation area of the chassis base 120, thereby improving the heat dissipating efficiency. Therefore, an additional reinforcing member 150'can be formed on an upper edge of the rear surface of the chassis base 120.

Figure 2:
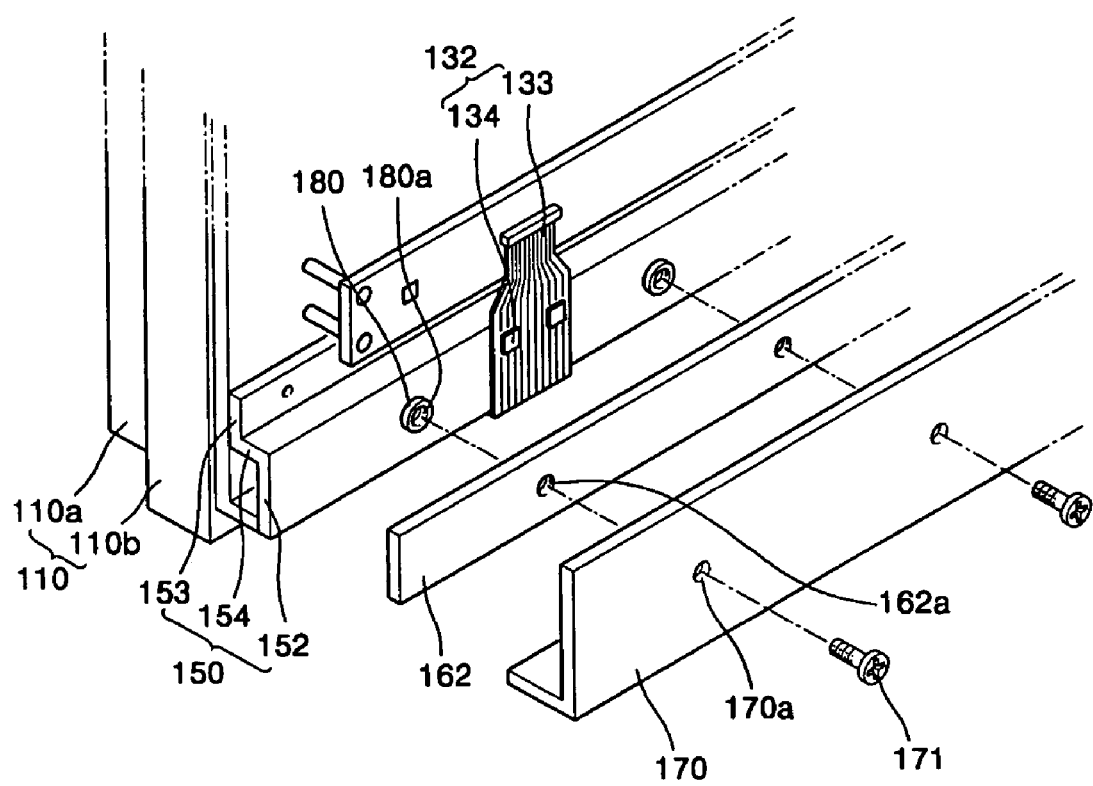
FIG. 2 is a perspective view of a reinforcing member and a cover member attached to each other while interposing a signal transmission member of FIG. 1.
Figure 3:
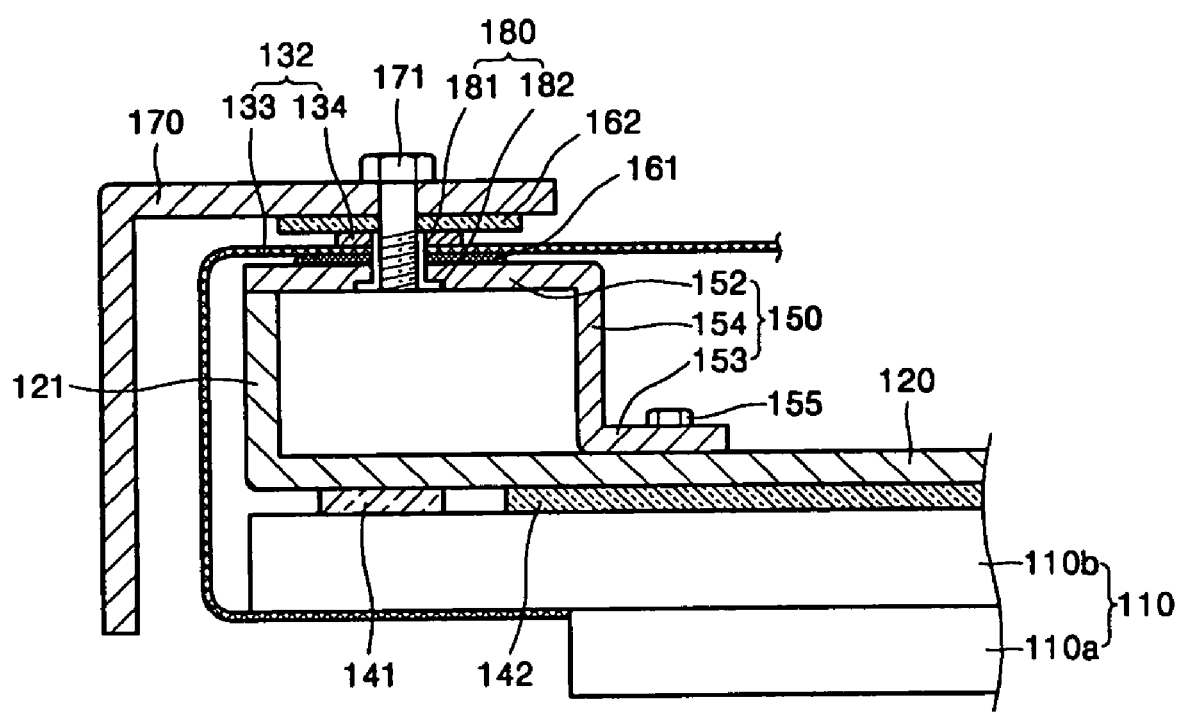
FIG. 3 is a partial perspective view of the plasma display apparatus taken along line III-III of FIG. 1.

Referring to FIG. 2, the reinforcing member 150 disposed adjacent to the lower edge of the rear surface of the chassis base 120 can be formed in various structures, for example, as shown in FIGS. 1 through 3, can be formed by bending a thin plate material. The reinforcing member 150 can include a mounting portion 152 separated from the chassis base 120 and parallel to the chassis base 120, a base portion 153 attached to the chassis base 120 by a screw 155, and a connection portion 154 respectively connected to the mounting portion 152 and the base portion 153.

Since the mounting portion 152 is separated from the chassis base 120, a predetermined space is formed between the mounting portion 152 and the chassis base 120, and thus, the heat generated by the devices 134 mounted on the mounting portion 152 can be dissipated sufficiently. In addition, an end portion of the mounting portion 152 contacts the end portion of the bending 121 of the chassis base 120, and thus, the end portion of the mounting portion 152 can be supported by the bending portion 121.

In addition, in the present embodiment, the reinforcing member is formed of an additional member and installed on the chassis base. However, the present invention is not limited thereto. That is, the present invention can be applied to a case where the reinforcing member is formed integrally with the chassis base by bending the end portion of the chassis base.

In addition, referring to FIG. 3, a first thermal conductive medium 161 and a second thermal conductive medium 162 can be disposed on both sides of the device 134 mounted on the mounting portion 152. That is, the first thermal conductive medium 161 is disposed between the wiring unit 133 where the devices 134 are mounted and the mounting portion 152, and since the portion of the wiring unit 133 where the devices 134 are mounted are not flat because of molding process, it is desirable that the first thermal conductive medium 161 is a liquid or gel type medium, for example, grease. Since the plasma display apparatus 100 is stood vertically to be used, the first thermal conductive medium 161 is viscous so as not to flow out between the mounted portion of the devices 134 on the wiring unit 133 and the mounting portion 152 due to gravity. The second thermal conductive medium 162 is disposed on the opposite side of the TCPs 132. That is, the second thermal conductive medium 162 is disposed on protruding surface of the devices 134, and since the devices 134 directly contact the second thermal conductive medium 162, it is desirable that the second thermal conductive medium 162 is formed of a shock-absorbing material to absorb the shock applied to the devices 134.

When the second thermal conductive medium 162 is disposed on the devices 134, a cover 170 is disposed to cover the second thermal conductive medium 162. The cover 170 can be formed of the plate material that is bent approximately at right angles so as to entirely cover the TCPs 132 that are disposed throughout the lower edge of the chassis base 120.

The cover 170 is attached to the reinforcing member 150 by a coupling unit. Therefore, the mounting portion 152 of the reinforcing member 150 includes bosses 180 that are disposed between the TCPs 132 and protrude to be predetermined heights toward the cover 170. Each of the bosses 180 includes a hollow portion from the end portion thereof, and a screw recess 180a is formed in the hollow portion so that screw 171 can be attached therein. The screws 171 pass through coupling holes 170a and 162a formed on the cover 170 and the second thermal conductive medium 162a corresponding to the bosses 180 from the rear portion of the cover member 170, and attached to the bosses 180 by screws, and thus, the reinforcing member 150 and the cover member 170 are fixed with respect to each other.

In the structure of coupling the bosses 180 and the cover 170, the bosses 180 protrude so that the cover 170 can be adhered to the second thermal conductive medium 162 covering the devices 134. In addition, when the cover 170 is formed of the metal with the reinforcing member 150, it can be grounded, and thus, the cover 170 can absorb and shield ElectroMagnetic Interference (EMI) generated by the devices 134 mounted on the TCPs 132.

As described above, the cover 170 is attached to the bosses 180 formed on the reinforcing member 150, where the devices 134 of the TCPs 132 are mounted, by screws, and the cover 170 is not attached to the chassis base 120, and thus, the reinforcing member 150 and the cover 170 can be substantially parallel to each other.

Figure 4:
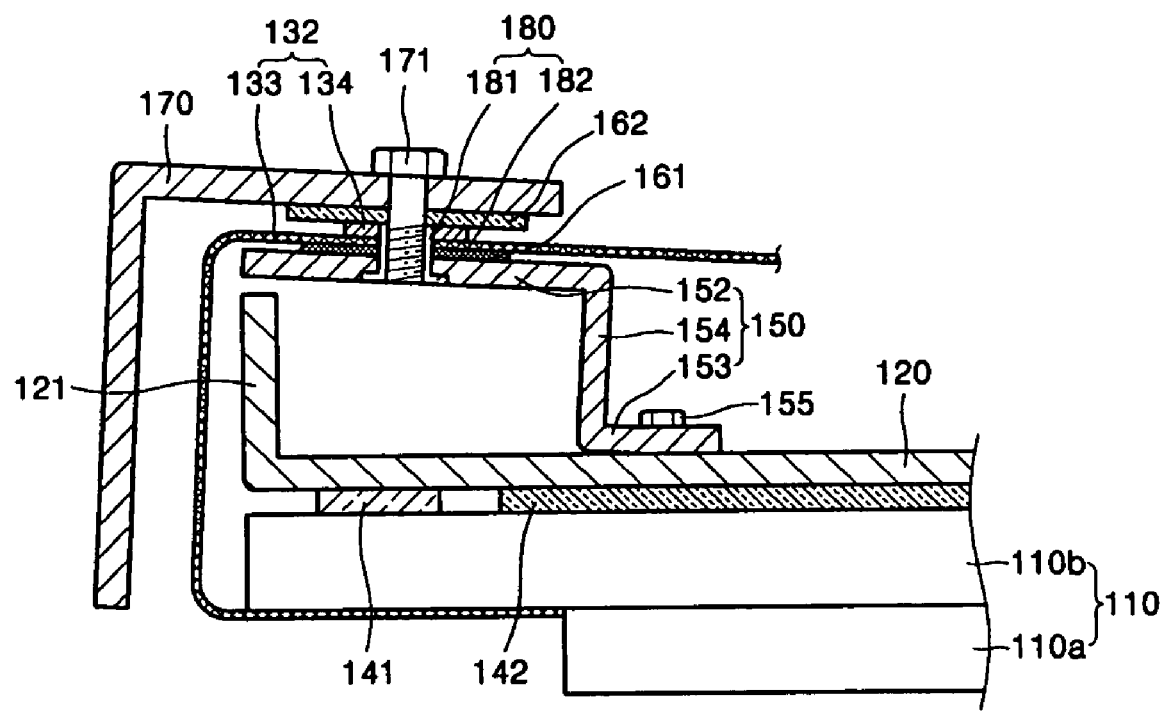
FIG. 4 is a partial cross-sectional view of an abnormal coupling of the reinforcing member and a chassis base of FIG. 3.

FIG. 4 is a cross-sectional view of a case where the reinforcing member that is slanted against the chassis base is attached to the chassis base.

Referring to FIG. 4, even when the reinforcing member 150 is abnormally slanted against the chassis base 120, the reinforcing member 150 and the cover 170 can be actually parallel to each other since the cover 170 is not attached to the chassis base 120. Accordingly, the even pressure can be applied on the devices 134 located between the reinforcing member 150 and the cover 170, the cracks on the devices generated by the local pressure can be prevented. Therefore, the operational reliability of the devices 134 can be improved.

In addition, referring to FIG. 3, the bosses 180 can be fabricated separately from the reinforcing member 150, and then, attached to the reinforcing member 150. In more detail, the boss 180 includes a body portion 181 including a hollow portion, in which the screw recess 180a is formed, and an extension portion 182 extending at the end portion of the body portion 181 in a radial direction. The body portion 181 of the boss 180 is inserted into a through hole 152a formed on the mounting portion 152 of the reinforcing member 150, and the extension portion 182 of the boss 180 is inserted in the through hole 152a, and thus, the boss 180 can be attached to the mounting portion 152 of the reinforcing member 150. However, the bosses 180 can be formed integrally with the reinforcing member 150, and thus, the present invention is not limited to the above example.

According to the present invention, even when the reinforcing member is abnormally slanted with respect to the chassis base and attached to the chassis base, the reinforcing member and the cover can be maintained parallel to each other. Therefore, even pressure can be applied to the devices located between the reinforcing member and the cover.

Therefore, damage to the devices such as cracks generated due to the locally excessive pressure in the conventional art can be prevented, and the operational reliability of the devices can be ensured.

In addition, according to the present invention, an increase of the fabrication costs due to the damage of expensive devices during the fabrication process can be prevented.

While the present invention has been particularly shown and described with reference to exemplary embodiments thereof, it will be understood by those of ordinary skill in the art that various modifications in form and detail can be made therein without departing from the spirit and scope of the present invention as defined by the following claims.

What is claimed is:

1. A plasma display apparatus, comprising:
a Plasma Display Panel (PDP);
a chassis base arranged on a rear portion of the PDP;
a circuit board arranged on a rear portion of the chassis base to drive the PDP;
at least one signal transmission member adapted to connect the PDP to the circuit board to transmit electrical signals therebetween and including at least one device;
a reinforcing member including a mounting portion, on which the at least one signal transmission member is arranged and the at least one device installed on the at least one signal transmission member is mounted, at an edge of the chassis base, and at least one boss arranged on the mounting portion;
a cover arranged on a rear portion of the at least one signal transmission member to cover the at least one device arranged on the at least one signal transmission member; and
a coupling unit adapted to attach the cover to the at least one boss of the reinforcing member.

2. The apparatus of claim 1, wherein the reinforcing member comprises a bent end portion of the chassis base.

3. The apparatus of claim 1, wherein the at least one boss comprises a plurality of bosses separated from each other and arranged on the mounting portion.

4. The apparatus of claim 1, wherein the at least one boss is integrally formed with the mounting portion.

5. The apparatus of claim 1, wherein the at least one device is arranged on the mounting portion which is separated from the chassis base to be parallel to the chassis base, and wherein the reinforcing member includes a base portion attached to the chassis base, and a connection portion adapted to connect the base portion to the mounting portion.

6. The apparatus of claim 1, wherein a first thermal conductive medium is arranged between the at least one device on the at least one signal transmission member and the reinforcing member.

7. The apparatus of claim 1, wherein a second thermal conductive medium is arranged between the at least one device on the at least one signal transmission member and the cover.

8. The apparatus of claim 7, wherein the second thermal conductive medium comprises a shock-absorbing material.

9. The apparatus of claim 7, wherein the at least one boss protrudes from the mounting portion to facilitate the cover being adhered to the second thermal conductive medium covering the at least one device.

* * * * *